(12) United States Patent
Phatak

(10) Patent No.: US 9,318,546 B1
(45) Date of Patent: Apr. 19, 2016

(54) DOPED ELECTRODE FOR DRAM CAPACITOR STACK

(71) Applicant: Intermolecular, Inc., San Jose, CA (US)

(72) Inventor: Prashant B. Phatak, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/507,418

(22) Filed: Oct. 6, 2014

(51) Int. Cl.
*H01L 21/20* (2006.01)
*H01L 21/28* (2006.01)
*H01L 49/02* (2006.01)
*H01L 27/108* (2006.01)
*H01L 21/02* (2006.01)
*H01L 21/285* (2006.01)

(52) U.S. Cl.
CPC .............. *H01L 28/75* (2013.01); *H01L 27/108* (2013.01); *H01L 27/10805* (2013.01); *H01L 28/65* (2013.01); *H01L 21/02197* (2013.01); *H01L 21/2855* (2013.01)

(58) Field of Classification Search
CPC .......... H01L 28/40; H01L 28/60; H01L 28/65
USPC ......................................... 257/663; 438/240
See application file for complete search history.

(56) References Cited

U.S. PATENT DOCUMENTS

| 8,318,572 | B1 | 11/2012 | Shanker et al. | |
|---|---|---|---|---|
| 8,349,696 | B1 | 1/2013 | Chen et al. | |
| 8,574,983 | B2 | 11/2013 | Ramani et al. | |
| 8,581,318 | B1 | 11/2013 | Chen et al. | |
| 2011/0204475 | A1 | 8/2011 | Rui et al. | |
| 2012/0171839 | A1 | 7/2012 | Chen et al. | |
| 2012/0287553 | A1* | 11/2012 | Ramani | H01G 4/306 361/301.4 |
| 2012/0322221 | A1* | 12/2012 | Chen | H01L 28/75 438/381 |
| 2013/0037913 | A1 | 2/2013 | Chen et al. | |
| 2013/0052791 | A1* | 2/2013 | Rui | H01L 28/40 438/396 |

OTHER PUBLICATIONS

Zavyalov et al.,"The Structure and Properties of Titanium Oxide Nanoheterogeneous Films Doped with Molybdenum Oxide", Apr. 30, 2010, Russian Journal of Physical Chemistry B, 2010, vol. 4, No. 6, pp. 1028-1032.*

* cited by examiner

*Primary Examiner* — Evan Pert
*Assistant Examiner* — Changhyun Yi

(57) ABSTRACT

In some embodiments, a metal oxide second electrode material is formed as part of a MIM DRAM capacitor stack. The second electrode material is doped with one or more dopants. The dopants may influence the crystallinity, resistivity, and/or work function of the second electrode material. The dopants may be uniformly distributed throughout the second electrode material or may be distributed with a gradient in their concentration profile.

19 Claims, 4 Drawing Sheets

DOPED ELECTRODE FOR DRAM CAPACITOR STACK

FIELD OF THE DISCLOSURE

The present invention relates generally to the field of dynamic random access memory (DRAM), and more particularly to methods of forming a capacitor stack for improved DRAM performance.

BACKGROUND OF THE DISCLOSURE

Dynamic Random Access Memory utilizes capacitors to store bits of information within an integrated circuit. A capacitor is formed by placing a dielectric material between two electrodes formed from conductive materials. A capacitor's ability to hold electrical charge (i.e., capacitance) is a function of the surface area of the capacitor plates A, the distance between the capacitor plates d, and the relative dielectric constant or k-value of the dielectric material. The capacitance is given by:

$$C = \kappa \varepsilon_o \frac{A}{d} \qquad \text{(Eqn. 1)}$$

where $\varepsilon_o$ represents the vacuum permittivity.

The dielectric constant is a measure of a material's polarizability. Therefore, the higher the dielectric constant of a material, the more electrical charge the capacitor can hold. Therefore, for a given desired capacitance, if the k-value of the dielectric is increased, the area of the capacitor can be decreased to maintain the same cell capacitance. Reducing the size of capacitors within the device is important for the miniaturization of integrated circuits. This allows the packing of millions (mega-bit (Mb)) or billions (giga-bit (Gb)) of memory cells into a single semiconductor device. The goal is to maintain a large cell capacitance (generally ~10 to 25 fF) and a low leakage current (generally $<10^{-7}$ A cm$^{-2}$). The physical thickness of the dielectric layers in DRAM capacitors cannot be reduced without limit in order to avoid leakage current caused by tunneling mechanisms which exponentially increases as the thickness of the dielectric layer decreases.

Traditionally, SiO$_2$ has been used as the dielectric material and semiconducting materials (semiconductor-insulator-semiconductor [SIS] cell designs) have been used as the electrodes. The cell capacitance was maintained by increasing the area of the capacitor using very complex capacitor morphologies while also decreasing the thickness of the SiO$_2$ dielectric layer. Increases of the leakage current above the desired specifications have demanded the development of new capacitor geometries, new electrode materials, and new dielectric materials. Cell designs have migrated to metal-insulator-semiconductor (MIS) and now to metal-insulator-metal (MIM) cell designs for higher performance.

Typically, DRAM devices at technology nodes of 80 nm and below use MIM capacitors wherein the electrode materials are metals. These electrode materials generally have higher conductivities than the semiconductor electrode materials, higher work functions, exhibit improved stability over the semiconductor electrode materials, and exhibit reduced depletion effects. The electrode materials must have high conductivity to ensure fast device speeds. Representative examples of electrode materials for MIM capacitors are metals, conductive metal oxides, conductive metal silicides, conductive metal nitrides (i.e. titanium nitride), or combinations thereof. MIM capacitors in these DRAM applications utilize insulating materials having a dielectric constant, or k-value, significantly higher than that of SiO$_2$ (k=3.9). For DRAM capacitors, the goal is to utilize dielectric materials with k-values greater than about 40. Such materials are generally classified as high-k materials. Representative examples of high-k materials for MIM capacitors are non-conducting metal oxides, non-conducting metal nitrides, non-conducting metal silicates or combinations thereof. These dielectric materials may also include additional dopant materials.

A figure of merit in DRAM technology is the electrical performance of the dielectric material as compared to SiO$_2$ known as the Equivalent Oxide Thickness (EOT). A high-k material's EOT is calculated using a normalized measure of silicon dioxide (SiO$_2$ k=3.9) as a reference, given by:

$$EOT = \frac{3.9}{\kappa} \cdot d \qquad \text{(Eqn. 2)}$$

where d represents the physical thickness of the capacitor dielectric.

As DRAM technologies scale below the 40 nm technology node, manufacturers must reduce the EOT of the high-k dielectric films in MIM capacitors in order to increase charge storage capacity. The goal is to utilize dielectric materials that exhibit an EOT of less than about 0.8 nm while maintaining a physical thickness of about 5-20 nm.

One class of high-k dielectric materials possessing the characteristics required for implementation in advanced DRAM capacitors are high-k metal oxide materials. Titanium oxide and zirconium oxide are two metal oxide dielectric materials which display significant promise in terms of serving as high-k dielectric materials for implementation in DRAM capacitors. Other metal oxide high-k dielectric materials that have attracted attention include aluminum oxide, barium-strontium-titanate (BST), erbium oxide, hafnium oxide, hafnium silicate, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, etc.

The dielectric constant of a dielectric material may be dependent upon the crystalline phase(s) of the material. For example, in the case of titanium oxide (specifically TiO$_2$), the anatase crystalline phase of TiO$_2$ has a dielectric constant of approximately 40, while the rutile crystalline phase of TiO$_2$ can have a dielectric constant of approximately >80. Due to the higher-k value of the rutile-phase, it is desirable to produce TiO$_2$ based DRAM capacitors with the TiO$_2$ in the rutile-phase. The relative amounts of the anatase phase and the rutile phase can be determined from x-ray diffraction (XRD). From Eqn. 1 above, a TiO$_2$ material in the rutile-phase could be physically thicker and maintain the desired capacitance. The increased physical thickness is important for lowering the leakage current of the capacitor. The anatase phase will transition to the rutile phase at high temperatures (>8000). However, high temperature processes are undesirable in the manufacture of DRAM devices.

The crystal phase of an adjacent material can be used to influence the growth of a specific crystal phase of a material if their crystal structures are similar and their lattice constants are similar. This technique is well known in technologies such as epitaxial growth. The same concepts have been extended to the growth of thin films where the adjacent material can be used as a "template" to encourage the growth of a desired crystalline phase over other competing crystal phases.

Generally, as the dielectric constant of a material increases, the band gap of the material decreases. This leads to high leakage current in the device. As a result, without the utilization of countervailing measures, capacitor stacks implementing high-k dielectric materials may experience large leakage currents. High work function electrodes (e.g., electrodes having a work function of greater than 5.0 eV) may be utilized in order to counter the effects of implementing a reduced band gap high-k dielectric material within the DRAM capacitor. Metals, such as platinum, gold, ruthenium, and ruthenium oxide are examples of high work function electrode materials suitable for inhibiting device leakage in a DRAM capacitor having a high-k dielectric material. The noble metal systems, however, are prohibitively expensive when employed in a mass production context. Moreover, electrodes fabricated from noble metals often suffer from poor manufacturing qualities, such as surface roughness, poor adhesion, and form a contamination risk in the fab.

Additionally, DRAM capacitor stacks may undergo various refinement process steps after fabrication. These refinement processes may include post-fabrication chemical and thermal processing (i.e., oxidation or reduction). For instance, after initial DRAM capacitor stack fabrication, a number of high temperature (up to about 600 C) processes may be applied to complete the device fabrication. During these subsequent process steps, the DRAM capacitor materials must remain chemically, physically, and structurally stable. They must maintain the structural, compositional, physical, and electrical properties that have been developed. Furthermore, they should not undergo significant interaction or reaction which may degrade the performance of the DRAM capacitor.

Conductive metal oxides, conductive metal silicides, conductive metal carbides, conductive metal nitrides, or combinations thereof comprise other classes of materials that may be suitable as DRAM capacitor electrodes. Generally, transition metals and their conductive binary compounds form good candidates as electrode materials. The transition metals exist in several oxidation states. Therefore, a wide variety of compounds are possible. Conductive metal nitrides such as titanium nitride, tantalum nitride, tungsten nitride, etc. have attracted interest as DRAM capacitor electrodes with titanium nitride being the most popular. Different compounds may have different crystal structures, electrical properties, etc. It is important to utilize the proper compound for the desired application.

In one example, molybdenum has several binary oxides of which $MoO_2$ and $MoO_3$ are two examples. These two oxides of molybdenum have different properties. $MoO_2$ is conductive and has shown great promise as an electrode material in DRAM capacitors. $MoO_2$ has a distorted rutile crystal structure and can serve as an acceptable template to promote the deposition of the rutile-phase of titanium oxide as discussed above. $MoO_2$ also has a high work function (can be >5.0 eV depending on process history) which helps to minimize the leakage current of the DRAM device. However, oxygen-rich phases ($MoO_{2+x}$) of $MoO_2$ degrade the performance of the $MoO_2$ electrode material because they act more like insulators and have crystal structures that do not promote the formation of the rutile-phase of titanium oxide. For example, $MoO_3$ (the most oxygen-rich phase) is a dielectric material and has an orthorhombic crystal structure.

Generally, a deposited thin film may be amorphous, crystalline, or a mixture thereof. Furthermore, several different crystalline phases may exist. Therefore, processes (both deposition and post-treatment) must be developed to maximize the formation of crystalline $MoO_2$ and to minimize the presence of $MoO_{2+x}$ phases. Deposition processes and post-treatment processes in an inert or reducing atmosphere have been developed that allow crystalline $MoO_2$ to be used as the first electrode material (i.e. bottom electrode) in MIM DRAM capacitors with $TiO_2$ or doped-$TiO_2$ high-k dielectric materials. Examples of the post-treatment process are further described in U.S. patent application Ser. No. 13/084,666 (now U.S. Pat. No. 8,813,325) filed on Apr. 12, 2011 which is herein incorporated by reference for all purposes. However, it has been difficult to integrate the use of crystalline $MoO_2$ as the second (e.g. top) electrode in a DRAM MIM stack without affecting the underlying dielectric layer.

SUMMARY OF THE DISCLOSURE

The following summary is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts in a simplified form as a prelude to the more detailed description that is presented below.

In some embodiments, a metal oxide second electrode material is formed as part of a MIM DRAM capacitor stack. The second electrode material is doped with one or more dopants. The dopants may influence the crystallinity, resistivity, and/or work function of the second electrode material. The dopants may be uniformly distributed throughout the second electrode material or may be distributed with a gradient in their concentration profile. The second electrode material may be formed as a single layer or may be formed from multiple layers.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

Figure 1:
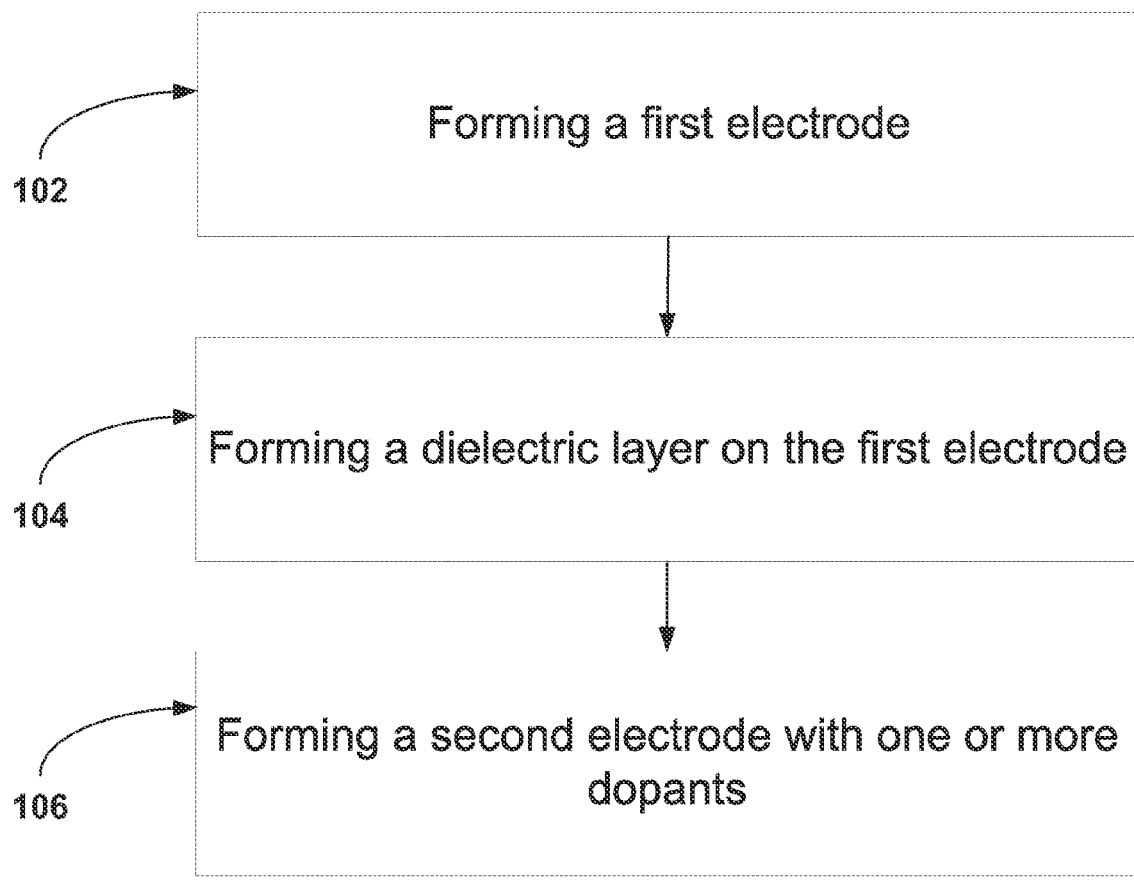
FIG. 1 illustrates a flow chart illustrating a method for fabricating a DRAM capacitor stack in accordance with some embodiments.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

It must be noted that as used herein and in the claims, the singular forms "a," "an," and "the" include plural referents unless the context clearly dictates otherwise. Thus, for example, reference to "a layer" includes two or more layers, and so forth.

Where a range of values is provided, it is understood that each intervening value, to the tenth of the unit of the lower limit unless the context clearly dictates otherwise, between the upper and lower limit of that range, and any other stated or intervening value in that stated range, is encompassed within the invention. The upper and lower limits of these smaller ranges may independently be included in the smaller ranges, and are also encompassed within the invention, subject to any specifically excluded limit in the stated range. Where the stated range includes one or both of the limits, ranges excluding either or both of those included limits are also included in the invention. Where the modifier "about" or "approximately" is used, the stated quantity can vary by up to 10%.

As used herein, the term "substantially" generally refers to ±5% of a stated value.

The term "horizontal" as used herein will be understood to be defined as a plane parallel to the plane or surface of the substrate, regardless of the orientation of the substrate. The term "vertical" will refer to a direction perpendicular to the horizontal as previously defined. Terms such as "above", "below", "bottom", "top", "side" (e.g. sidewall), "higher", "lower", "upper", "over", and "under", are defined with respect to the horizontal plane. The term "on" means there is direct contact between the elements. The term "above" will allow for intervening elements.

As used herein, a material (e.g. a dielectric material or an electrode material) will be considered to be "crystalline" if it exhibits greater than or equal to 30% crystallinity as measured by a technique such as x-ray diffraction (XRD).

The term "substrate" as used herein may refer to any workpiece on which formation or treatment of material layers is desired. Non-limiting examples include silicon, germanium, silica, sapphire, zinc oxide, silicon carbide, aluminum nitride, gallium nitride, Spinel, silicon on oxide, silicon carbide on oxide, glass, gallium nitride, indium nitride, aluminum nitride, glasses, combinations or alloys thereof, and other solid materials.

As used herein, the notation "Mo—O" and "MoO" and "$MoO_x$" will be understood to be equivalent and will be used interchangeably and will be understood to include a material containing these elements in any ratio. Where a specific composition is discussed, the atomic concentrations (or ranges) will be provided. The notation is extendable to other materials and other elemental combinations (e.g. Mo—O—N, MoON, $MoON_x$, etc.) discussed herein.

As used herein, the terms "film" and "layer" will be understood to represent a portion of a stack. They will be understood to cover both a single layer as well as a multilayered structure (i.e. a nanolaminate). As used herein, these terms will be used synonymously and will be considered equivalent.

As used herein, the term "between" (when used with a range of values) will be understood to mean that both boundary values and any value between the boundaries can be within the scope of the range.

As used herein, the terms "first," "second," and other ordinals will be understood to provide differentiation only, rather than imposing any specific spatial or temporal order.

As used herein, the term "oxide" (of an element) will be understood to include additional components besides the element and oxygen, including but not limited to a dopant or alloy.

As used herein, the term "nitride" (of an element) will be understood to include additional components besides the element and nitrogen, including but not limited to a dopant or alloy.

Dopants can be added to the dielectric material to increase the k-value and/or decrease the leakage current. As used herein, the dopant may be electrically active or not electrically active. The definition excludes residues and impurities such as carbon, etc. that may be present in the material due to inefficiencies of the process or impurities in the precursor materials. The concentration of the dopant is one factor that affects the crystallinity of the dielectric material. Other factors that affect the crystallinity of the dielectric material comprise annealing time, annealing temperature, film thickness, etc. Generally, as the concentration of the dopant is increased, the crystallization temperature of the dielectric material increases.

Dopants can be added to the electrode material to alter the resistivity and/or influence the crystallinity. As used herein, the dopant may be electrically active or not electrically active. The definition excludes residues and impurities such as carbon, etc. that may be present in the material due to inefficiencies of the process or impurities in the precursor materials. The concentration of the dopant is one factor that affects the crystallinity of the dielectric material. Other factors that affect the crystallinity of the electrode material comprise annealing time, annealing temperature, film thickness, etc.

The term "nanolaminate", as used herein, will be understood to be defined as a material or layer that is formed from the deposition of a plurality of sub-layers. Typically, the sub-layers include different materials and the different sub-layers are alternated in a predetermined ratio of thicknesses and/or compositions.

As used herein, the term "flash layer" will be understood to describe an additional layer inserted between the first (e.g. bottom) electrode layer and the dielectric layer.

As used herein, the term "capping layer" will be understood to describe an additional layer inserted between the second (e.g. top) electrode layer and the dielectric layer.

As used herein, the term "blocking layer" will be understood to describe an additional generic layer inserted either between the first (e.g. bottom) electrode layer and the dielectric layer, between the second (e.g. top) electrode layer and the dielectric layer, or both. As defined above, both "flash layers" and "capping layers" are examples of the more general "blocking layer".

As used herein, the term "inert gas" will be understood to include noble gases (He, Ne, Ar, Kr, Xe) and, unless the text or context excludes it (e.g., by describing nitride formation as undesirable), nitrogen ($N_2$).

As used herein, the term "monolayer" will be understood to include a single layer of atoms or molecules covering a surface, with substantially all available bonding sites satisfied and substantially all individual members of the adsorbed species in direct physical contact with the underlying surface.

As used herein, the term "sub-monolayer" or "pre-wetting layer" will be understood to include a partial or incomplete monolayer; maximum thickness is one atom or molecule, but not all available bonding sites on the surface are covered, so that the average thickness is less than one atom or molecule.

As used herein, the term "Surface" will be understood to describe the boundary between the ambient environment and a feature of the substrate.

DRAM capacitor stacks are formed from a number of deposited thin films. Generally, a deposited thin film may be amorphous, crystalline, or a mixture thereof. Furthermore, several different crystalline phases may exist. Therefore, processes (both deposition and post-treatment) must be developed to maximize the formation of the desired composition and crystalline phase of the thin film. The thin films used to form the MIM DRAM capacitor stack may be formed using any common technique such as atomic layer deposition (ALD), plasma enhanced atomic layer deposition (PE-ALD), atomic vapor deposition (AVD), ultraviolet assisted atomic layer deposition (UV-ALD), chemical vapor deposition (CVD), plasma enhanced chemical vapor deposition (PECVD), or physical vapor deposition (PVD). Generally, because of the complex morphology of the DRAM capacitor structure, ALD, PE-ALD, AVD, or CVD are preferred methods of formation. However, any of these techniques are suitable for forming each of the various materials discussed below. Those skilled in the art will appreciate that the teachings described below are not limited by the technology used for the deposition process.

Figure 2A:
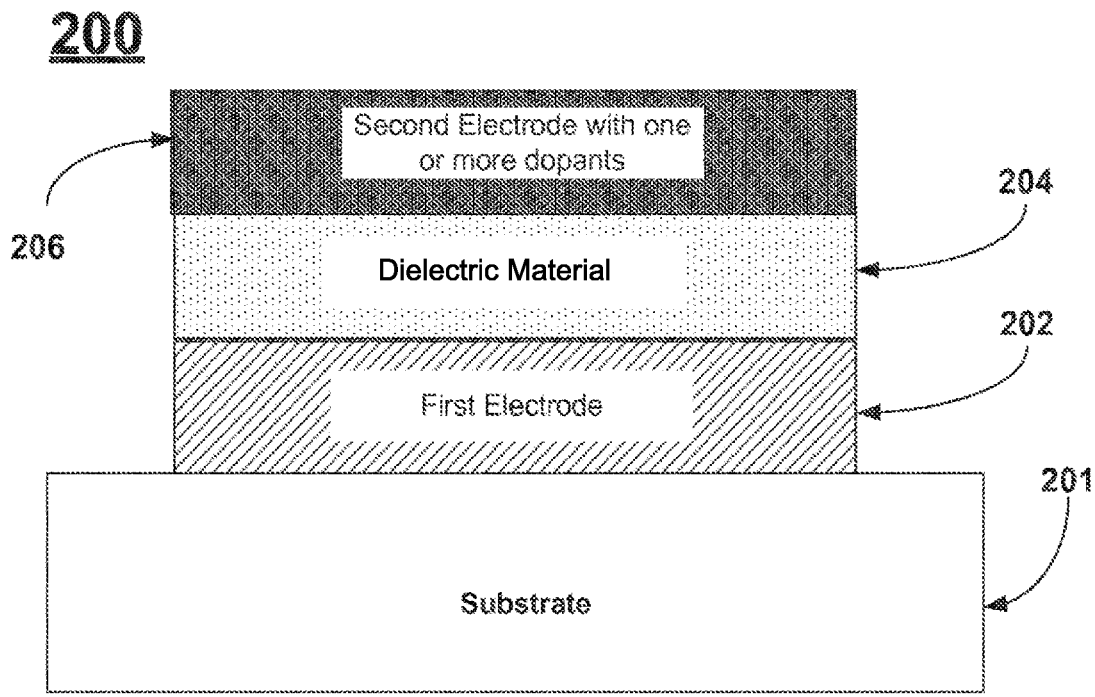
FIGS. 2A and 2B illustrate simplified cross-sectional views of a DRAM capacitor stack fabricated in accordance with some embodiments.
Figure 2B:
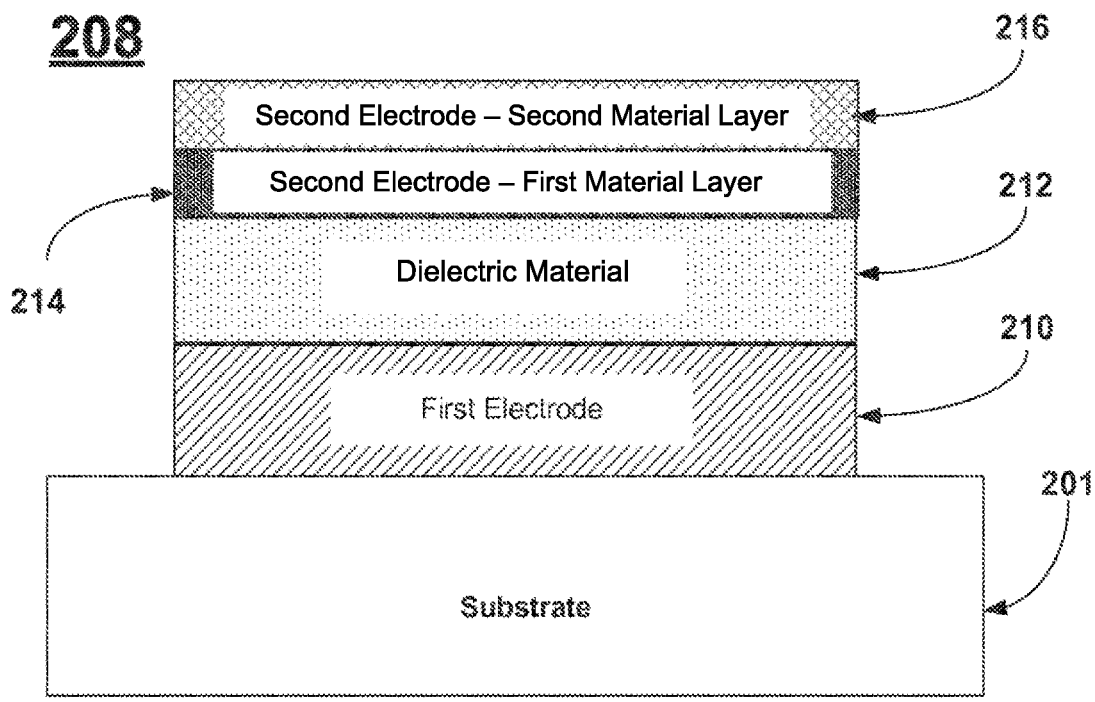
Figure 3:
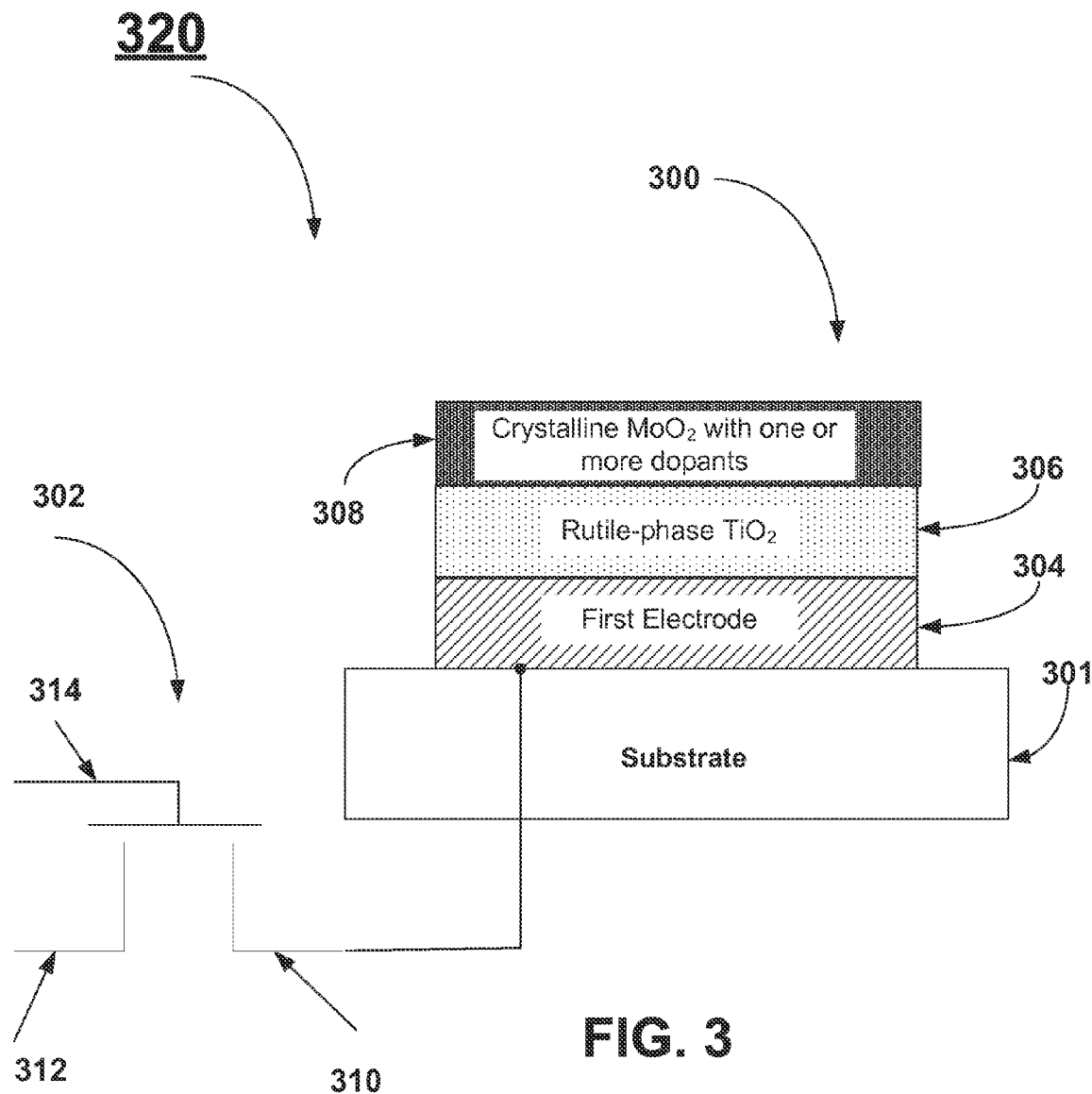
FIG. 3 illustrates a simplified cross-sectional view of a DRAM memory cell fabricated in accordance with some embodiments.
Figure 4:
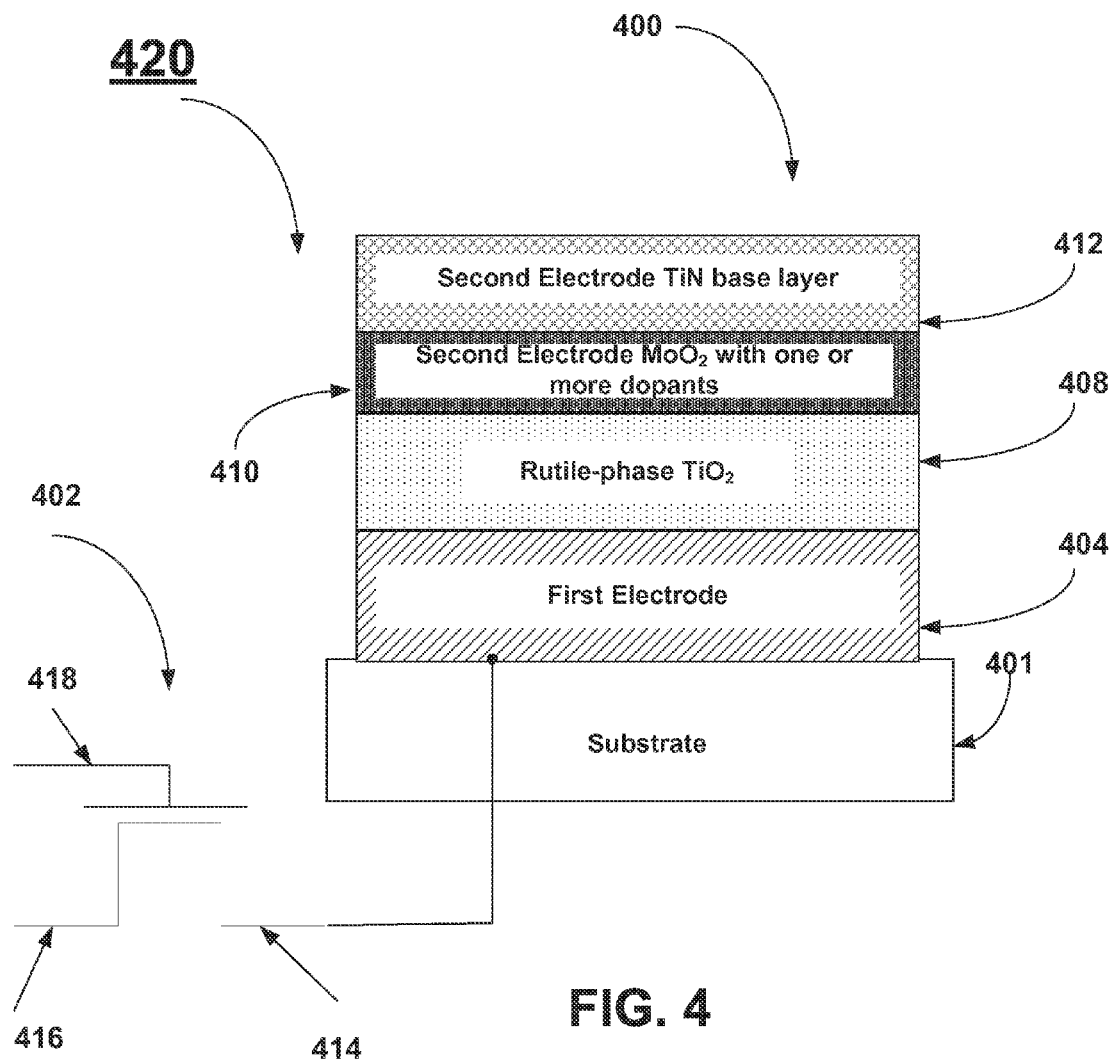
FIG. 4 illustrates a simplified cross-sectional view of a DRAM memory cell fabricated in accordance with some embodiments.

In FIGS. 2-4 below, a capacitor stack is illustrated using a simple planar structure. Those skilled in the art will appreciate that the description and teachings to follow can be readily applied to any simple or complex capacitor morphology. The drawings are for illustrative purposes only and do not limit the application of the present invention.

Leakage current in capacitor dielectric materials can be due to Schottky emission, Frenkel-Poole defects (e.g. oxygen vacancies ($V_{ox}$) or grain boundaries), or Fowler-Nordheim tunneling. Schottky emission, also called thermionic emission, is a common mechanism and is the thermally activated flow of charge over an energy barrier whereby the effective barrier height of a MIM capacitor controls leakage current. The nominal barrier height is a function of the difference between the work function of the electrode and the electron affinity of the dielectric. The electron affinity of a dielectric is closely related to the conduction band offset of the dielectric. The Schottky emission behavior of a dielectric layer is generally determined by the properties of the dielectric/electrode interface. Frenkel-Poole emission allows the conduction of charges through a dielectric layer through the interaction with defect sites such as vacancies, grain boundaries, and the like. As such, the Frenkel-Poole emission behavior of a dielectric layer is generally determined by the dielectric layer's bulk properties. Fowler-Nordheim emission allows the conduction of charges through a dielectric layer through direct tunneling without any intermediary interaction with e.g. defects. As such, the Fowler-Nordheim emission behavior of a dielectric layer is generally determined by the physical thickness of the dielectric layer. This leakage current is a primary driving force in the adoption of high-k dielectric materials. The use of high-k materials allows the physical thickness of the dielectric layer to be as thick as possible while maintaining the required capacitance (see Eqn 1 above).

The mechanisms for charge transport discussed above suggest that there are several parameters that influence the leakage current across the metal-dielectric interface. Examples of the parameters include physical thickness of the dielectric material, the band gap of the dielectric material, the work function of the metal, the Schottky barrier height (SBH) between the metal and the dielectric material, etc. The SBH has been found to be influenced by many variables such as the composition of the metal and the dielectric, doping levels, defect densities, processing conditions, etc.

As discussed previously, conductive metal oxide materials such as molybdenum oxide are candidates for electrode materials due to their high work function values. Additionally, they have crystal structures that are generally complimentary to those of high k dielectric materials (e.g. the rutile phase of titanium oxide). Transition metals such as molybdenum can exist in a number of valence states. As an example, the molybdenum in $MoO_2$ is in the +4 valence state and the molybdenum in $MoO_3$ is in the +6 valence state. For very thin molybdenum oxide films (i.e. <about 10 nm), it is difficult to precisely control the Mo:O atomic ratio. This leads to a higher resistance material which may not meet the resistivity and device speed requirements for future DRAM devices. Typically, molybdenum oxide is present as $MoO_3$ (or more generally $MoO_{2+x}$) after deposition. The film may be treated to convert the $MoO_3$ to conductive $MoO_2$. When used as the first (e.g. bottom) electrode in the capacitor stack, this treatment may include a thermal anneal treatment. This anneal treatment serves to convert the $MoO_3$ to $MoO_2$ and to crystallize the $MoO_2$ before the dielectric layer is deposited above the first electrode.

The integration of molybdenum oxide as a second electrode (e.g. top) layer has been difficult. The thermal treatments employed to the first electrode that convert the $MoO_3$ to $MoO_2$ and to crystallize the $MoO_2$ may have a negative impact on the performance of the dielectric layer. Typically, an "oxygen sink" must be employed to scavenge the excess oxygen without impacting the underlying dielectric layer. In some embodiments, one or more dopants are added to the molybdenum oxide to alter the crystallinity. Some materials that are attractive as dopants for molybdenum oxide comprise elements Group-4 (e.g. Ti, Zr, Hf) of the periodic table (using the new IUPAC designations). These elements may be incorporated into the molybdenum oxide as either the metal oxide (e.g. titanium oxide) or as the metal nitride (e.g. titanium nitride).

FIG. 1 describes a method, 100, for fabricating a DRAM capacitor stack. The initial step, 102, includes forming a first electrode material above a substrate, wherein the first electrode material comprises a metal element. Examples of suitable electrode materials comprise metals, conductive metal oxides, conductive metal silicides, conductive metal nitrides, and combinations thereof. Particularly interesting classes of materials include the conductive metal oxides and the conductive metal nitrides. The next step, 104, includes forming a dielectric material above the first electrode material. Optionally, the dielectric material can then be subjected to a post dielectric anneal (PDA) treatment (not shown). The PDA step serves to crystallize the dielectric material and fill oxygen vacancies. The next step, 106, includes forming a second electrode material above the dielectric material, wherein the second electrode material comprises a metal element. Examples of suitable second electrode materials comprise metals, conductive metal oxides, conductive metal silicides, conductive metal nitrides, and combinations thereof. A particularly interesting class of materials is the conductive metal oxides. The second electrode material is formed with one or more dopants added that alter the work function, crystallinity, and/or the resistivity of the second electrode material. The dopants may be uniformly distributed throughout the second electrode material or may be distributed with a gradient in their concentration profile. In some embodiments, the second electrode material is formed from layers of different materials. As an example, the second electrode material may be formed from a metal or conductive metal nitride and a conductive metal oxide. Optionally, the capacitor stack can then be subjected to PMA treatment process (not shown). Examples of the PDA and PMA treatments are further described in U.S. patent application Ser. No. 13/159,842 (now U.S. Pat. No. 8,815,677) filed on Jun. 14, 2011, which is herein incorporated by reference for all purposes.

In some embodiments wherein the dopants are distributed throughout the second electrode material with a gradient in their concentration profile, it may be advantageous to distribute the dopant such that the concentration of the dopant is lowest at the second electrode material/dielectric material interface. This distribution will decrease the amount of the dopant that may diffuse into the dielectric material during subsequent anneal steps. Some dopants may negatively impact the performance of the dielectric material (i.e. lower the k-value, increase the EOT performance, increase the leakage current, etc.).

The dopants may be added to the second electrode material by introducing the dopant species during the formation of the second electrode material. Typically, the second electrode materials are formed using ALD or CVD technologies. In these cases, precursors containing the dopant atoms may be introduced during the process sequence of the ALD or CVD deposition step. The dopants may be metals, metal oxides, metal nitrides, metal silicides, metal carbides, non-metals, halogens, or combinations thereof (i.e. metal-silicon-nitride, or metal-silicon-oxygen-nitride, etc). The metal oxides, metal nitrides, metal silicides, metal carbides, and combinations may be suitable as dopants because many of these compounds are conductive, and as such, may advantageously alter the work function, crystallinity, and/or resistivity of the electrode material. The dopants may be added individually or may be added in combination. The dopants may be uniformly distributed throughout the second electrode material or may be distributed with a gradient in their concentration profile. The dopants may be added to a concentration that will not negatively impact the ability of the second electrode material to form the desired crystalline phase. The maximum doping concentration will vary depending on the dopant material and subsequent anneal conditions. Generally, the doping concentration is chosen such that it does not prevent the second electrode from crystallizing during the subsequent anneal step. As used herein, the second electrode material will be considered to be crystallized if it is ≥30% crystalline after the anneal as determined by techniques such as x-ray diffraction (XRD).

In some embodiments, dopants including titanium oxide are added to a second electrode material that includes molybdenum oxide. In some embodiments, the dopants are added in a range between about 1 atomic % and about 20 atomic %, such as between about 5 atomic % and about 15 atomic %. Without being limited by theory, it is believed that the titanium oxide serves two purposes as a dopant within the molybdenum oxide. Firstly, the titanium oxide may serve as an "oxygen sink" and scavenge oxygen from the molybdenum oxide as it is converted from $MoO_3$ to $MoO_2$. Secondly, the titanium oxide may exist in a rutile crystal structure. Molybdenum oxide may also exist as a distorted rutile crystal structure. Therefore, the titanium oxide may serve to promote the crystallization of the molybdenum oxide during subsequent anneal treatments. This may allow the molybdenum oxide to be crystallized at lower temperatures that will not negatively affect performance of the underlying dielectric materials.

In some embodiments, dopants including titanium nitride are added to a second electrode material that includes molybdenum oxide. In some embodiments, the dopants are added in a range between about 1 atomic % and about 20 atomic %, such as between about 5 atomic % and about 15 atomic %. Without being limited by theory, it is believed that the titanium nitride serves two purposes as a dopant within the molybdenum oxide. Firstly, the titanium nitride may serve as an "oxygen sink" and scavenge oxygen from the molybdenum oxide as it is converted from $MoO_3$ to $MoO_2$. Secondly, the titanium nitride may exist in a cubic crystal structure. Molybdenum oxide may exist as a distorted rutile crystal structure. Molybdenum oxide in the form of $MoO_2$ forms readily on titanium nitride. Therefore, the titanium nitride may serve to promote the crystallization of the molybdenum oxide during subsequent anneal treatments. This may allow the molybdenum oxide to be crystallized at lower temperatures that will not negatively affect performance of the underlying dielectric materials.

FIG. 2A illustrates a simple capacitor stack, 200, consistent with some embodiments. Using the method as outlined in FIG. 1 and described above, first electrode material, 202, is formed above substrate, 201. Generally, the substrate has already received several processing steps in the manufacture of a full DRAM device. First electrode material, 202, comprises one of metals, conductive metal oxides, conductive metal nitrides, conductive metal silicides, etc. In some embodiments, the first electrode material is a conductive metal oxide. The first electrode material, 502, can be annealed to crystallize the material.

In the next step, dielectric material, 204, would then be formed above the first electrode material, 202. A wide variety of dielectric materials have been targeted for use in DRAM capacitors. Examples of suitable dielectric materials comprise aluminum oxide, barium-strontium-titanate (BST), erbium oxide, hafnium oxide, hafnium silicate, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, etc. or doped versions of the same. These dielectric materials may be formed as a single layer or may be formed as a hybrid or nanolaminate structure. In some embodiments, the dielectric material is titanium oxide. In some embodiments, the dielectric material is zirconium oxide. Typically, dielectric material, 204, is subjected to a PDA treatment before the formation of the second electrode material as mentioned earlier.

In the next step, the second electrode material, 206, is formed above dielectric material, 204. The second electrode material comprises one of metals, conductive metal oxides, conductive metal nitrides, conductive metal silicides, conductive metal carbides, etc. The second electrode material is formed with one or more dopants added that alter the work function, crystallinity, and/or the resistivity of the second electrode material. The dopants may be uniformly distributed throughout the second electrode material or may be distributed with a gradient in their concentration profile.

Dopants may be added to the second electrode material to alter properties such as the work function, crystallinity, and/or the resistivity. The dopants may be added to the second electrode material by introducing the dopant species during the formation of the second electrode material. Typically, the second electrode materials are formed using ALD or CVD technologies. In these cases, precursors containing the dopant atoms may be introduced during the process sequence of the ALD or CVD deposition step. The dopants may be metals, metal oxides, metal nitrides, metal silicides, metal carbides, non-metals, halogens, or combinations thereof (i.e. metal-silicon-nitride, or metal-silicon-oxygen-nitride, etc). The metal oxides, metal nitrides, metal silicides, metal carbides, and combinations may be suitable as dopants because many of these compounds are conductive, and as such, may advantageously alter the work function, crystallinity, and/or resistivity of the electrode material. The dopants may be added individually or may be added in combination. The dopants may be uniformly distributed throughout the second electrode material or may be distributed with a gradient in their concentration profile. A second class of dopants may be added to the second electrode material to alter the resistivity. The dopants may be metals, metal oxides, metal nitrides, metal silicides, metal carbides, non-metals, halogens, or combinations thereof (i.e. metal-silicon-nitride, or metal-silicon-oxygen-nitride, etc). The metal oxides, metal nitrides, metal silicides, metal carbides, and combinations may be suitable as dopants because many of these compounds are conductive, and as such, may advantageously alter the work function, crystallinity, and/or resistivity of the electrode material. The dopants may be added individually or may be added in combination. The dopants may be uniformly distributed throughout the second electrode material or may be distributed with a gradient in their concentration profile. The maximum doping concentration will vary depending on the dopant material and subsequent anneal conditions. Generally, the doping concentration is chosen such that it does not prevent the second electrode material from crystallizing during the subsequent anneal step. As used herein, the second electrode material will be considered to be crystallized if it is ≥30% crystalline after the anneal as determined by techniques such as x-ray diffraction (XRD). Typically, the capacitor stack would then be subjected to a PMA treatment. The doped second electrode material may contribute in lowering the leakage current of the capacitor stack.

In some embodiments, dopants including titanium oxide are added to a second electrode material that includes molybdenum oxide. In some embodiments, the dopants are added in a range between about 1 atomic % and about 20 atomic %, such as between about 5 atomic % and about 15 atomic %. Without being limited by theory, it is believed that the titanium oxide serves two purposes as a dopant within the molybdenum oxide. Firstly, the titanium oxide may serve as an "oxygen sink" and scavenge oxygen from the molybdenum oxide as it is converted from $MoO_3$ to $MoO_2$. Secondly, the titanium oxide may exist in a rutile crystal structure. Molybdenum oxide may also exist as a distorted rutile crystal structure. Therefore, the titanium oxide may serve to promote the crystallization of the molybdenum oxide during subsequent anneal treatments. This may allow the molybdenum oxide to be crystallized at lower temperatures that will not negatively affect performance of the underlying dielectric materials.

In some embodiments, dopants including titanium nitride are added to a second electrode material that includes molybdenum oxide. In some embodiments, the dopants are added in a range between about 1 atomic % and about 20 atomic %, such as between about 5 atomic % and about 15 atomic %. Without being limited by theory, it is believed that the titanium nitride serves two purposes as a dopant within the molybdenum oxide. Firstly, the titanium nitride may serve as an "oxygen sink" and scavenge oxygen from the molybdenum oxide as it is converted from $MoO_3$ to $MoO_2$. Secondly, the titanium nitride may exist in a cubic crystal structure. Molybdenum oxide may also exist as a distorted rutile crystal structure. Molybdenum oxide in the form of $MoO_2$ forms readily on titanium nitride. Therefore, the titanium nitride may serve to promote the crystallization of the molybdenum oxide during subsequent anneal treatments. This may allow the molybdenum oxide to be crystallized at lower temperatures that will not negatively affect performance of the underlying dielectric materials.

FIG. 2B illustrates a simple capacitor stack, 208, consistent with some embodiments. Using the method as outlined in FIG. 1 and described above, first electrode material, 210, is formed above substrate, 201. Generally, the substrate has already received several processing steps in the manufacture of a full DRAM device. First electrode material, 210, comprises one of metals, conductive metal oxides, conductive metal nitrides, conductive metal silicides, etc. In some embodiments, the first electrode material is a conductive metal oxide. The first electrode material, 210, can be annealed to crystallize the material.

In the next step, dielectric material, 212, would then be formed above the first electrode material, 210. A wide variety of dielectric materials have been targeted for use in DRAM capacitors. Examples of suitable dielectric materials comprise aluminum oxide, barium-strontium-titanate (BST), erbium oxide, hafnium oxide, hafnium silicate, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, etc. or doped versions of the same. These dielectric materials may be formed as a single layer or may be formed as a hybrid or nanolaminate structure. In some embodiments, the dielectric material is titanium oxide. In some embodiments, the dielectric material is zirconium oxide. Typically, dielectric material, 212, is subjected to a PDA treatment before the formation of the second electrode material as mentioned earlier.

In the next step, the second electrode structure is comprised of multiple layers of material. The first material layer, 214, is formed above dielectric material, 212. The first material layer, 214, comprises one of metals, conductive metal oxides, conductive metal nitrides, conductive metal silicides, conductive metal carbides, etc. The first material layer additionally comprises one or more dopants added that alter the work function, crystallinity, and/or the resistivity of the first material layer, 214. The dopants may be uniformly distributed throughout the first material layer, 214, or may be distributed with a gradient in their concentration profile. Second material layer, 216, is formed above first material layer, 214, and comprises one of metals, conductive metal oxides, conductive metal nitrides, conductive metal silicides, etc. Optionally, the second material layer, 216, can be doped as discussed below. The purpose of this layer is to provide high conductivity to the second electrode structure. In some embodiments, the second material layer 216 is a metal or a conductive metal nitride.

Dopants may be added to the second electrode structure materials to alter properties such as the work function, crystallinity, and/or the resistivity. The dopants may be added to the second electrode structure materials by introducing the dopant species during the formation of the second electrode structure materials. Typically, the second electrode structure materials are formed using ALD or CVD technologies. In these cases, precursors containing the dopant atoms may be introduced during the process sequence of the ALD or CVD deposition step. The dopants may be metals, metal oxides, metal nitrides, metal silicides, metal carbides, non-metals, halogens, or combinations thereof (i.e. metal-silicon-nitride, or metal-silicon-oxygen-nitride, etc). The metal oxides, metal nitrides, metal silicides, metal carbides, and combinations may be suitable as dopants because many of these compounds are conductive, and as such, may advantageously alter the work function, crystallinity, and/or resistivity of the electrode material. The dopants may be added individually or may be added in combination. The dopants may be uniformly distributed throughout the second electrode structure materials or may be distributed with a gradient in their concentration profile. A second class of dopants may be added to the second electrode material to alter the resistivity. The dopants may be metals, metal oxides, metal nitrides, metal silicides, metal carbides, non-metals, halogens, or combinations thereof (i.e. metal-silicon-nitride, or metal-silicon-oxygen-nitride, etc). The metal oxides, metal nitrides, metal silicides, metal carbides, and combinations may be suitable as dopants because many of these compounds are conductive, and as such, may advantageously alter the work function, crystallinity, and/or resistivity of the electrode material. The dopants may be added individually or may be added in combination. The dopants may be uniformly distributed throughout the second electrode structure materials or may be distributed with a gradient in their concentration profile. The maximum doping concentration will vary depending on the dopant material and subsequent anneal conditions. Generally, the doping concentration is chosen such that it does not prevent the second electrode structure materials from crystallizing during the subsequent anneal step. As used herein, the second electrode structure materials will be considered to be crystallized if they are ≥30% crystalline after the anneal as determined by techniques such as x-ray diffraction (XRD). Typically, the capacitor stack would then be subjected to a PMA treatment. The doped second electrode structure may contribute in lowering the leakage current of the capacitor stack.

In some embodiments, dopants including titanium oxide are added to a second electrode material that includes molybdenum oxide. In some embodiments, the dopants are added in a range between about 1 atomic % and about 20 atomic %, such as between about 5 atomic % and about 15 atomic %. Without being limited by theory, it is believed that the titanium oxide serves two purposes as a dopant within the molybdenum oxide. Firstly, the titanium oxide may serve as an "oxygen sink" and scavenge oxygen from the molybdenum oxide as it is converted from $MoO_3$ to $MoO_2$. Secondly, the titanium oxide may exist in a rutile crystal structure. Molybdenum oxide may also exist as a distorted rutile crystal structure. Therefore, the titanium oxide may serve to promote the crystallization of the molybdenum oxide during subsequent anneal treatments. This may allow the molybdenum oxide to be crystallized at lower temperatures that will not negatively affect performance of the underlying dielectric materials.

In some embodiments, dopants including titanium nitride are added to a second electrode material that includes molybdenum oxide. In some embodiments, the dopants are added in a range between about 1 atomic % and about 20 atomic %, such as between about 5 atomic % and about 15 atomic %. Without being limited by theory, it is believed that the titanium nitride serves two purposes as a dopant within the molybdenum oxide. Firstly, the titanium nitride may serve as an "oxygen sink" and scavenge oxygen from the molybdenum oxide as it is converted from $MoO_3$ to $MoO_2$. Secondly, the titanium nitride may exist in a cubic crystal structure. Molybdenum oxide may exist as a distorted rutile crystal structure. Molybdenum oxide in the form of $MoO_2$ forms readily on titanium nitride. Therefore, the titanium nitride may serve to promote the crystallization of the molybdenum oxide during subsequent anneal treatments. This may allow the molybdenum oxide to be crystallized at lower temperatures that will not negatively affect performance of the underlying dielectric materials.

In some embodiments, a first electrode material, 202, comprising between about 3 nm and about 15 nm of molybdenum oxide is formed above a substrate, 201. The molybdenum oxide electrode material is formed at a process temperature between about 125 C and about 400 C using an ALD process technology. Optionally, the substrate with the first electrode material is then annealed in an inert or reducing atmosphere comprising between about 1% and about 10% $H_2$ in $N_2$ or other inert gases and advantageously between about 5% and about 10% $H_2$ in $N_2$ or other inert gases between about 300 C and about 650 C for between about 1 millisecond and about 60 minutes.

In the next step, dielectric material, 204, would then be formed above the annealed first electrode material, 202. A wide variety of dielectric materials have been targeted for use in DRAM capacitors. Examples of suitable dielectric materials comprise aluminum oxide, barium-strontium-titanate (BST), erbium oxide, hafnium oxide, hafnium silicate, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, etc. or doped versions of the same. These dielectric materials may be formed as a single layer or may be formed as a hybrid or nanolaminate structure. Typically, dielectric material, 204, is subjected to a PDA treatment before the formation of the second electrode as discussed previously. A specific dielectric material of interest is titanium oxide doped with aluminum to between about 5 atomic % and about 15 atomic % aluminum. The rutile phase of titanium oxide will form preferentially on the underlying doped molybdenum oxide electrode resulting in a higher k value.

In a specific example, the dielectric material comprises between about 4 nm to about 10 nm of titanium oxide wherein at least 30% of the titanium oxide is present in the rutile phase after an anneal treatment. Generally, the titanium oxide dielectric material may either be a single film or may comprise a nanolaminate. Advantageously, the titanium oxide material is doped with aluminum at a concentration between about 5 atomic % and about 15 atomic % aluminum. The titanium oxide dielectric material is formed at a process temperature between about 200 C and 350 C using an ALD process technology. The substrate with the first electrode material and dielectric material is then annealed in an oxidizing atmosphere comprising between about 0% $O_2$ to about 100% $O_2$ in $N_2$ and advantageously between about 0% $O_2$ to about 20% $O_2$ in $N_2$ at temperatures between about 300 C to about 650 C for between about 1 millisecond to about 60 minutes.

In a specific example, the dielectric material comprises between about 4 nm to about 10 nm of zirconium oxide wherein at least 30% of the zirconium oxide is present in the tetragonal phase after an anneal treatment. Generally, the zirconium oxide dielectric material may either be a single film or may comprise a nanolaminate. Advantageously, the zirconium oxide material is doped with aluminum at a concentration between about 5 atomic % and about 15 atomic % aluminum. The zirconium oxide dielectric material is formed at a process temperature between about 200 C and 350 C using an ALD process technology. The substrate with the first electrode material and dielectric material is then annealed in an oxidizing atmosphere comprising between about 0% $O_2$ to about 100% $O_2$ in $N_2$ and advantageously between about 0% $O_2$ to about 20% $O_2$ in $N_2$ at temperatures between about 300 C to about 650 C for between about 1 millisecond to about 60 minutes.

Second electrode material, 206, is then formed above dielectric material, 204. The second electrode is typically a metal such as ruthenium, platinum, titanium nitride, tantalum nitride, titanium-aluminum-nitride, tungsten, tungsten nitride, molybdenum, molybdenum oxide, molybdenum nitride, vanadium nitride, or others. Advantageously, the second electrode material is molybdenum oxide. The second electrode material is typically between about 3 nm and 50 nm in thickness. As discussed previously, the second electrode material may also be doped with one or more dopants to alter the work function, crystallinity, and/or the resistivity of the second electrode material as described previously.

In some embodiments, dopants including titanium oxide are added to a second electrode material that includes molybdenum oxide. In some embodiments, the dopants are added in a range between about 1 atomic % and about 20 atomic %, such as between about 5 atomic % and about 15 atomic %. Without being limited by theory, it is believed that the titanium oxide serves two purposes as a dopant within the molybdenum oxide. Firstly, the titanium oxide may serve as an "oxygen sink" and scavenge oxygen from the molybdenum oxide as it is converted from $MoO_3$ to $MoO_2$. Secondly, the titanium oxide may exist in a rutile crystal structure. Molybdenum oxide may also exist as a distorted rutile crystal structure. Therefore, the titanium oxide may serve to promote the crystallization of the molybdenum oxide during subsequent anneal treatments. This may allow the molybdenum oxide to be crystallized at lower temperatures that will not negatively affect performance of the underlying dielectric materials.

In some embodiments, dopants including titanium nitride are added to a second electrode material that includes molybdenum oxide. In some embodiments, the dopants are added in a range between about 1 atomic % and about 20 atomic %, such as between about 5 atomic % and about 15 atomic %. Without being limited by theory, it is believed that the titanium nitride serves two purposes as a dopant within the molybdenum oxide. Firstly, the titanium nitride may serve as an "oxygen sink" and scavenge oxygen from the molybdenum oxide as it is converted from $MoO_3$ to $MoO_2$. Secondly, the titanium nitride may exist in a cubic crystal structure. Molybdenum oxide may exist as a distorted rutile crystal structure. Molybdenum oxide in the form of $MoO_2$ forms readily on titanium nitride. Therefore, the titanium nitride may serve to promote the crystallization of the molybdenum oxide during subsequent anneal treatments. This may allow the molybdenum oxide to be crystallized at lower temperatures that will not negatively affect performance of the underlying dielectric materials.

Typically, the capacitor stack is then subjected to a post metallization anneal (PMA) treatment. The PMA treatment serves to crystallize the second electrode material and to anneal defects and interface states that are formed at the dielectric/second electrode interface during the deposition. The doped second electrode material may contribute in lowering the leakage current of the capacitor stack.

Using the method as outlined in FIG. 1 and described above, first electrode material, 210, is formed above substrate, 201. Generally, the substrate has already received several processing steps in the manufacture of a full DRAM device. First electrode material, 210, comprises one of metals, conductive metal oxides, conductive metal nitrides, conductive metal silicides, etc. In some embodiments, the first electrode material is a conductive metal oxide. The first electrode material, 210, can be annealed to crystallize the material.

In the next step, dielectric material, 212, would then be formed above the first electrode material, 210. A wide variety of dielectric materials have been targeted for use in DRAM capacitors. Examples of suitable dielectric materials comprise aluminum oxide, barium-strontium-titanate (BST), erbium oxide, hafnium oxide, hafnium silicate, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, etc. or doped versions of the same. These dielectric materials may be formed as a single layer or may be formed as a hybrid or nanolaminate structure. In some embodiments, the dielectric material is titanium oxide. In some embodiments, the dielectric material is zirconium oxide. Typically, dielectric material, 212, is subjected to a PDA treatment before the formation of the second electrode material as mentioned earlier.

In a specific example, the dielectric material comprises between about 4 nm to about 10 nm of titanium oxide wherein at least 30% of the titanium oxide is present in the rutile phase after an anneal treatment. Generally, the titanium oxide dielectric material may either be a single film or may comprise a nanolaminate. Advantageously, the titanium oxide material is doped with aluminum at a concentration between about 5 atomic % and about 15 atomic % aluminum. The titanium oxide dielectric material is formed at a process temperature between about 200 C and 350 C using an ALD process technology. The substrate with the first electrode structure and dielectric material is then annealed in an oxidizing atmosphere comprising between about 0% $O_2$ to about 100% $O_2$ in $N_2$ and advantageously between about 0% $O_2$ to about 20% $O_2$ in $N_2$ at temperatures between about 300 C to about 650 C for between about 1 millisecond to about 60 minutes.

In a specific example, the dielectric material comprises between about 4 nm to about 10 nm of zirconium oxide wherein at least 30% of the zirconium oxide is present in the tetragonal phase after an anneal treatment. Generally, the zirconium oxide dielectric material may either be a single film or may comprise a nanolaminate. Advantageously, the zirconium oxide material is doped with aluminum at a concentration between about 5 atomic % and about 15 atomic % aluminum. The zirconium oxide dielectric material is formed at a process temperature between about 200 C and 350 C using an ALD process technology. The substrate with the first electrode structure and dielectric material is then annealed in an oxidizing atmosphere comprising between about 0% $O_2$ to about 100% $O_2$ in $N_2$ and advantageously between about 0% $O_2$ to about 20% $O_2$ in $N_2$ at temperatures between about 300 C to about 650 C for between about 1 millisecond to about 60 minutes.

In the next step, the second electrode structure is comprised of multiple layers of material. The first material layer, 214, is formed above dielectric material, 212. The first material layer, 214, comprises one of metals, conductive metal oxides, conductive metal nitrides, conductive metal silicides, conductive metal carbides, etc. More specifically, in some embodiments, first material layer, 214, comprises conductive metal compounds of molybdenum oxide. The first material layer, 214, additionally comprises one or more dopants added that alter the work function, crystallinity, and/or the resistivity of the first material layer, 214. The dopants may be uniformly distributed throughout the first material layer, 214, or may be distributed with a gradient in their concentration profile. Second material layer, 216, is formed above first material layer, 214, and comprises one of metals, conductive metal oxides, conductive metal nitrides, conductive metal silicides, etc. In one example, second material layer, 216, comprises titanium nitride. Optionally, the second material layer, 216, can be doped as discussed below. The purpose of this layer is to provide high conductivity to the second electrode structure. In some embodiments, the second material layer is a metal or a conductive metal nitride.

Dopants may be added to the second electrode structure materials to alter properties such as the work function, crystallinity, and the resistivity. In some embodiments, the dopants are added in a range between about 1 atomic % and about 20 atomic %, such as between about 5 atomic % and about 15 atomic %. The dopants may be added to the second electrode structure materials by introducing the dopant species during the formation of the second electrode structure materials. Typically, the second electrode structure materials are formed using ALD or CVD technologies. In these cases, precursors containing the dopant atoms may be introduced during the process sequence of the ALD or CVD deposition step. The dopants may be metals, metal oxides, metal nitrides, metal silicides, metal carbides, non-metals, halogens, or combinations thereof (i.e. metal-silicon-nitride, or metal-silicon-oxygen-nitride, etc). The metal oxides, metal nitrides, metal silicides, metal carbides, and combinations may be suitable as dopants because many of these compounds are conductive, and as such, may advantageously alter the work function, crystallinity, and/or resistivity of the electrode material. The dopants may be added individually or may be added in combination. The dopants may be uniformly distributed throughout the second electrode structure materials or may be distributed with a gradient in their concentration profile. A second class of dopants may be added to the second electrode materials to alter the resistivity. The dopants may be metals, metal oxides, metal nitrides, metal silicides, metal carbides, non-metals, halogens, or combinations thereof (i.e. metal-silicon-nitride, or metal-silicon-oxygen-nitride, etc). The metal oxides, metal nitrides, metal silicides, metal carbides, and combinations may be suitable as dopants because many of these compounds are conductive, and as such, may advantageously alter the work function, crystallinity, and/or resistivity of the electrode material. The dopants may be added individually or may be added in combination. The dopants may be uniformly distributed throughout the second electrode structure materials or may be distributed with a gradient in their concentration profile. The maximum doping concentration will vary depending on the dopant material and subsequent anneal conditions. Generally, the doping concentration is chosen such that it does not prevent the second electrode structure materials from crystallizing during the subsequent anneal step. As used herein, the second electrode structure materials will be considered to be crystallized if they are ≥30% crystalline after the anneal as determined by techniques such as x-ray diffraction (XRD). Typically, the capacitor stack would then be subjected to a PMA treatment.

In some embodiments, a second electrode material comprising about 50 nm of titanium nitride is formed above a third electrode material comprising between about 5 nm and about 20 nm of molybdenum oxide. These thicknesses are used as examples. Future DRAM devices will require molybdenum oxide thickness of about 2 nm to 3 nm and titanium nitride thicknesses of about 2 nm to 3 nm. The total thickness of the second electrode structure for future DRAM devices will be about 6 nm. The molybdenum oxide electrode material is formed at a process temperature between about 125 C and about 400 C using an ALD process technology. One or more dopants are added to the molybdenum oxide which alter the work function, crystallinity, and/or the resistivity. Examples of suitable dopants comprise titanium, zirconium, hafnium, or combinations thereof. Typically, the capacitor stack would then be subjected to a PMA treatment.

In some embodiments, dopants including titanium oxide are added to a second electrode material that includes molybdenum oxide. In some embodiments, the dopants are added in a range between about 1 atomic % and about 20 atomic %, such as between about 5 atomic % and about 15 atomic %. Without being limited by theory, it is believed that the titanium oxide serves two purposes as a dopant within the molybdenum oxide. Firstly, the titanium oxide may serve as an "oxygen sink" and scavenge oxygen from the molybdenum oxide as it is converted from $MoO_3$ to $MoO_2$. Secondly, the titanium oxide may exist in a rutile crystal structure. Molybdenum oxide may also exist as a distorted rutile crystal structure. Therefore, the titanium oxide may serve to promote the crystallization of the molybdenum oxide during subsequent anneal treatments. This may allow the molybdenum oxide to be crystallized at lower temperatures that will not negatively affect performance of the underlying dielectric materials.

In some embodiments, dopants including titanium nitride are added to a second electrode material that includes molybdenum oxide. In some embodiments, the dopants are added in a range between about 1 atomic % and about 20 atomic %, such as between about 5 atomic % and about 15 atomic %. Without being limited by theory, it is believed that the titanium nitride serves two purposes as a dopant within the molybdenum oxide. Firstly, the titanium nitride may serve as an "oxygen sink" and scavenge oxygen from the molybdenum oxide as it is converted from $MoO_3$ to $MoO_2$. Secondly, the titanium nitride may exist in a cubic crystal structure. Molybdenum oxide may exist as a distorted rutile crystal structure. Molybdenum oxide in the form of $MoO_2$ forms readily on titanium nitride. Therefore, the titanium nitride may serve to promote the crystallization of the molybdenum oxide during subsequent anneal treatments. This may allow the molybdenum oxide to be crystallized at lower temperatures that will not negatively affect performance of the underlying dielectric materials.

An example of a specific application of some embodiments is in the fabrication of capacitors used in the memory cells in DRAM devices. DRAM memory cells effectively use a capacitor to store charge for a period of time, with the charge being electronically "read" to determine whether a logical "one" or "zero" has been stored in the associated cell. Conventionally, a cell transistor is used to access the cell. The cell transistor is turned "on" in order to store data on each associated capacitor and is otherwise turned "off" to isolate the capacitor and preserve its charge. More complex DRAM cell structures exist, but this basic DRAM structure will be used for illustrating the application of this disclosure to capacitor manufacturing and to DRAM manufacturing. FIG. 3 is used to illustrate one DRAM cell, 320, manufactured using a doped first electrode structure as discussed previously. The cell, 320, is illustrated schematically to include two principle components, a cell capacitor, 300, and a cell transistor, 302. The cell transistor is usually constituted by a MOS transistor having a gate, 314, source, 310, and drain, 312. The gate is usually connected to a word line and one of the source or drain is connected to a bit line. The cell capacitor has a lower or storage electrode and an upper or plate electrode. The storage electrode is connected to the other of the source or drain and the plate electrode is connected to a reference potential conductor. The cell transistor is, when selected, turned "on" by an active level of the word line to read or write data from or into the cell capacitor via the bit line.

As was described previously, the cell capacitor, 300, comprises a first electrode, 304, formed on substrate, 301. The first electrode, 304, is connected to the source or drain of the cell transistor, 302. For illustrative purposes, the first electrode has been connected to the source, 310, in this example. For the purposes of illustration, first electrode material, 304, will be crystalline $MoO_2$ in this example as described previously. The first electrode material may contribute in lowering the leakage current of the capacitor stack. As discussed previously, first electrode material, 304, may be subjected to an anneal in an inert or reducing atmosphere before the formation of the dielectric material to crystallize the $MoO_2$ and to reduce any $MoO_{2+x}$ compounds that may have formed during the formation of the first electrode material. Dielectric material, 306, is formed above the first electrode material. Examples of suitable dielectric materials comprise aluminum oxide, barium-strontium-titanate (BST), erbium oxide, hafnium oxide, hafnium silicate, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, etc. or doped versions of the same. For the purposes of illustration, dielectric material, 806, will be rutile-phase $TiO_2$ or tetragonal phase $ZrO_2$. As discussed previously, the $TiO_2$ or the $ZrO_2$ may be doped. Typically, the dielectric material is then subjected to a PDA treatment. The second electrode material, 308, is then formed above the dielectric material. For the purposes of illustration, the second electrode material, 308, will be $MoO_2$ in this example. As discussed previously, the second electrode material may be doped with one or more dopants to alter the work function and/or the resistivity of the second electrode material as described previously. The capacitor stack is then subjected to a PMA treatment. This completes the formation of the capacitor stack.

In some embodiments, dopants including titanium oxide are added to a second electrode material that includes molybdenum oxide. In some embodiments, the dopants are added in a range between about 1 atomic % and about 20 atomic %, such as between about 5 atomic % and about 15 atomic %. Without being limited by theory, it is believed that the titanium oxide serves two purposes as a dopant within the molybdenum oxide. Firstly, the titanium oxide may serve as an "oxygen sink" and scavenge oxygen from the molybdenum oxide as it is converted from $MoO_3$ to $MoO_2$. Secondly, the titanium oxide may exist in a rutile crystal structure. Molybdenum oxide may also exist as a distorted rutile crystal structure. Therefore, the titanium oxide may serve to promote the crystallization of the molybdenum oxide during subsequent anneal treatments. This may allow the molybdenum oxide to be crystallized at lower temperatures that will not negatively affect performance of the underlying dielectric materials.

In some embodiments, dopants including titanium nitride are added to a second electrode material that includes molybdenum oxide. In some embodiments, the dopants are added in a range between about 1 atomic % and about 20 atomic %, such as between about 5 atomic % and about 15 atomic %. Without being limited by theory, it is believed that the titanium nitride serves two purposes as a dopant within the molybdenum oxide. Firstly, the titanium nitride may serve as an "oxygen sink" and scavenge oxygen from the molybdenum oxide as it is converted from $MoO_3$ to $MoO_2$. Secondly, the titanium nitride may exist in a cubic crystal structure. Molybdenum oxide may exist as a distorted rutile crystal structure. Molybdenum oxide in the form of $MoO_2$ forms readily on titanium nitride. Therefore, the titanium nitride may serve to promote the crystallization of the molybdenum oxide during subsequent anneal treatments. This may allow the molybdenum oxide to be crystallized at lower temperatures that will not negatively affect performance of the underlying dielectric materials.

FIG. 4 is used to illustrate another DRAM cell, 420, manufactured using a first electrode structure and a doped second electrode structure as discussed previously. In this example, the second electrode structure includes multiple layers of materials. The cell, 420, is illustrated schematically to include two principle components, a cell capacitor, 400, and a cell transistor, 402. The cell transistor is usually constituted by a MOS transistor having a gate, 418, source, 414, and drain, 416. The gate is usually connected to a word line and one of the source or drain is connected to a bit line. The cell capacitor has a lower or storage electrode and an upper or plate electrode. The storage electrode is connected to the other of the source or drain and the plate electrode is connected to a reference potential conductor. The cell transistor is, when selected, turned "on" by an active level of the word line to read or write data from or into the cell capacitor via the bit line.

As was described previously, the cell capacitor, 400, comprises a first electrode material. First material layer, 404, is formed on substrate, 401. The first electrode structure is connected to the source or drain of the cell transistor, 402. For illustrative purposes, the first electrode structure has been connected to the source, 414, in this example. First material layer, 404, comprises one of metals, conductive metal oxides, conductive metal nitrides, conductive metal silicides, etc. Optionally, the first material layer, 404, can be doped as discussed below. The purpose of this layer is to provide high conductivity to the first electrode structure. In some embodiments the first material is a metal or a conductive metal nitride. As an example, the first material may be titanium nitride. For the purposes of another example, first electrode layer, 404, may be crystalline $MoO_2$ doped with one or more dopants in this example as described previously. As used herein, the first electrode structure materials will be considered to be crystallized if they are ≥3% crystalline after the anneal as determined by techniques such as x-ray diffraction (XRD). The doped first electrode structure may contribute in lowering the leakage current of the capacitor stack. As discussed previously, first electrode structure, 404, may be subjected to an anneal in an inert or reducing atmosphere before the formation of the dielectric material to crystallize the $MoO_2$ and to reduce any $MoO_{2+x}$ compounds that may have formed during the formation of the first electrode material.

Dielectric material, 408, is formed above the first electrode structure. Examples of suitable dielectric materials comprise aluminum oxide, barium-strontium-titanate (BST), erbium oxide, hafnium oxide, hafnium silicate, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, etc. or doped versions of the same. For the purposes of illustration, dielectric material, 408, will be rutile-phase $TiO_2$ or tetragonal phase $ZrO_2$. As discussed previously, the $TiO_2$ or $ZrO_2$ may be doped. Typically, the dielectric material is then subjected to a PDA treatment.

In the next step, the second electrode structure is comprised of multiple layers of material. The first material layer, 410, is formed above dielectric material, 1008. The first material layer, 410, comprises one of metals, conductive metal oxides, conductive metal nitrides, conductive metal silicides, conductive metal carbides, etc. For the purposes of illustration, first material layer, 410, will be crystalline $MoO_2$ doped with one or more dopants in this example as described previously. The dopants may be uniformly distributed throughout the first material layer, 410, or may be distributed with a gradient in their concentration profile. Second material layer, 412, is formed above first material layer, 410, and comprises one of metals, conductive metal oxides, conductive metal nitrides, conductive metal silicides, etc. Optionally, the second material layer, 412, and be doped as discussed below. The purpose of this layer is to provide high conductivity to the second electrode structure. In some embodiments, the second material layer, 412, is a metal or a conductive metal nitride. As an example, second material layer, 412, comprises titanium nitride.

Dopants may be added to the second electrode structure materials to alter properties such as the work function and the resistivity. In some embodiments, the dopants are added in a range between about 1 atomic % and about 20 atomic %, such as between about 5 atomic % and about 15 atomic %. The dopants may be added to the second electrode structure materials by introducing the dopant species during the formation of the second electrode structure materials. Typically, the second electrode structure materials are formed using ALD or CVD technologies. In these cases, precursors containing the dopant atoms may be introduced during the process sequence of the ALD or CVD deposition step. The dopants may be metals, metal oxides, metal nitrides, metal silicides, metal carbides, non-metals, halogens, or combinations thereof (i.e. metal-silicon-nitride, or metal-silicon-oxygen-nitride, etc). The metal oxides, metal nitrides, metal silicides, metal carbides, and combinations may be suitable as dopants because many of these compounds are conductive, and as such, may advantageously alter the work function and/or resistivity of the electrode material. The dopants may be added individually or may be added in combination. The dopants may be uniformly distributed throughout the second electrode structure materials or may be distributed with a gradient in their concentration profile. A second class of dopants may be added to the second electrode material to alter the resistivity. The dopants may be metals, metal oxides, metal nitrides, metal silicides, metal carbides, non-metals, halogens, or combinations thereof (i.e. metal-silicon-nitride, or metal-silicon-oxygen-nitride, etc). The metal oxides, metal nitrides, metal silicides, metal carbides, and combinations may be suitable as dopants because many of these compounds are conductive, and as such, may advantageously alter the work function and/or resistivity of the electrode material. The dopants may be added individually or may be added in combination. The dopants may be uniformly distributed throughout the second electrode structure materials or may be distributed with a gradient in their concentration profile. The maximum doping concentration will vary depending on the dopant material and subsequent anneal conditions. Generally, the doping concentration is chosen such that it does not prevent the second electrode structure materials from crystallizing during the subsequent anneal step. As used herein, the second electrode structure materials will be considered to be crystallized if they are ≥30% crystalline after the anneal as determined by techniques such as x-ray diffraction (XRD). Typically, the capacitor stack would then be subjected to a PMA treatment. The doped second electrode material may contribute in lowering the leakage current of the capacitor stack.

In some embodiments, dopants including titanium oxide are added to a second electrode material that includes molybdenum oxide. In some embodiments, the dopants are added in a range between about 1 atomic % and about 20 atomic %, such as between about 5 atomic % and about 15 atomic %. Without being limited by theory, it is believed that the titanium oxide serves two purposes as a dopant within the molybdenum oxide. Firstly, the titanium oxide may serve as an "oxygen sink" and scavenge oxygen from the molybdenum oxide as it is converted from $MoO_3$ to $MoO_2$. Secondly, the titanium oxide may exist in a rutile crystal structure. Molybdenum oxide may also exist as a distorted rutile crystal structure. Therefore, the titanium oxide may serve to promote the crystallization of the molybdenum oxide during subsequent anneal treatments. This may allow the molybdenum oxide to be crystallized at lower temperatures that will not negatively affect performance of the underlying dielectric materials.

In some embodiments, dopants including titanium nitride are added to a second electrode material that includes molybdenum oxide. In some embodiments, the dopants are added in a range between about 1 atomic % and about 20 atomic %, such as between about 5 atomic % and about 15 atomic %. Without being limited by theory, it is believed that the titanium nitride serves two purposes as a dopant within the molybdenum oxide. Firstly, the titanium nitride may serve as an "oxygen sink" and scavenge oxygen from the molybdenum oxide as it is converted from $MoO_3$ to $MoO_2$. Secondly, the titanium nitride may exist in a cubic crystal structure. Molybdenum oxide may exist as a distorted rutile crystal structure. Molybdenum oxide in the form of $MoO_2$ forms readily on titanium nitride. Therefore, the titanium nitride may serve to promote the crystallization of the molybdenum oxide during subsequent anneal treatments. This may allow the molybdenum oxide to be crystallized at lower temperatures that will not negatively affect performance of the underlying dielectric materials.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A capacitor stack comprising:
a first electrode layer formed above a substrate;
a dielectric material formed above the first electrode layer; and
a second electrode structure formed above the dielectric material;
wherein the second electrode structure comprises a first material layer and a second material layer having a different composition than the first material layer,
wherein the first material layer directly interfaces the dielectric material and comprises molybdenum oxide,
wherein the first material layer further comprises a dopant having a concentration of between 1 atomic % and 20 atomic %,
wherein the dopant comprises titanium oxide, and
wherein the second material layer comprising titanium nitride.

2. The capacitor stack of claim 1 wherein the first electrode layer comprises one of metals, conductive metal oxides, conductive metal nitrides, or conductive metal silicides.

3. The capacitor stack of claim 2 wherein the first electrode structure comprises a conductive compound of molybdenum oxide.

4. The capacitor stack of claim 1 wherein the dielectric material comprises one of titanium oxide or zirconium oxide.

5. The capacitor stack of claim 1 wherein the first material layer of the second electrode structure comprises one of metals, conductive metal oxides, conductive metal nitrides, or conductive metal silicides.

6. The capacitor stack of claim 1 wherein the dopant has a concentration gradient at least within the first material layer of the second electrode structure.

7. The capacitor stack of claim 6 wherein the concentration of the dopant is lowest at an interface with the dielectric material.

8. The capacitor stack of claim 1 wherein the concentration of the dopant in the first material layer of the second electrode structure is between 5 atomic % and 15 atomic %.

9. The capacitor stack of claim 1 wherein the first material layer of the second electrode structure comprises one of conductive metal oxides.

10. The capacitor stack of claim 1 wherein the first material layer of the second electrode structure comprises a conductive compound of molybdenum oxide.

11. The capacitor stack of claim 1 wherein the first material layer of the second electrode structure has a rutile crystal structure.

12. The capacitor stack of claim 1 wherein the dielectric material comprises one of aluminum oxide, barium-strontium-titanate (BST), erbium oxide, hafnium oxide, hafnium silicate, lanthanum oxide, niobium oxide, lead-zirconium-titanate (PZT), a bilayer of silicon oxide and silicon nitride, silicon oxy-nitride, strontium titanate (STO), tantalum oxide, titanium oxide, or zirconium oxide.

13. The capacitor stack of claim 12 wherein the dielectric material further comprises a dopant.

14. The capacitor stack of claim 1 wherein the dielectric material has a hybrid structure or a nanolaminate structure.

15. The capacitor stack of claim 1 wherein the dielectric material is zirconium oxide.

16. The capacitor stack of claim 15 wherein zirconium oxide of the dielectric material has a tetragonal phase.

17. The capacitor stack of claim 1 wherein the dielectric material is titanium oxide.

18. The capacitor stack of claim 17 wherein titanium oxide of the dielectric material has a rutile phase.

19. The capacitor stack of claim 1 wherein the dopant is uniformly distributed within the first material layer of the second electrode structure.

* * * * *